(12) United States Patent
Suzuki et al.

(10) Patent No.: US 7,924,077 B2
(45) Date of Patent: Apr. 12, 2011

(54) SIGNAL PROCESSING APPARATUS INCLUDING LATCH CIRCUIT

(75) Inventors: Hiroki Suzuki, Saitama (JP); Akihiko Futami, Saitama (JP)

(73) Assignee: Sanken Electric Co., Ltd. (JP)

( * ) Notice: Subject to any disclaimer, the term of this patent is extended or adjusted under 35 U.S.C. 154(b) by 3 days.

(21) Appl. No.: 12/605,626

(22) Filed: Oct. 26, 2009

(65) Prior Publication Data

US 2010/0102866 A1      Apr. 29, 2010

(30) Foreign Application Priority Data

Oct. 29, 2008    (JP) .................................. 2008-278358

(51) Int. Cl.
*H03K 3/02* (2006.01)
(52) U.S. Cl. ........................................ 327/198; 327/199
(58) Field of Classification Search .......... 327/198–199, 327/215–219
See application file for complete search history.

(56) References Cited

U.S. PATENT DOCUMENTS

| | | | | |
|---|---|---|---|---|
| 4,716,322 A | * | 12/1987 | D'Arrigo et al. | 327/143 |
| 5,519,346 A | * | 5/1996 | Haddad et al. | 327/143 |
| 5,629,642 A | * | 5/1997 | Yoshimura | 327/142 |
| 5,910,739 A | * | 6/1999 | Stanojevic | 327/143 |

FOREIGN PATENT DOCUMENTS

JP        11-082269        3/1999

* cited by examiner

*Primary Examiner* — An T Luu
(74) *Attorney, Agent, or Firm* — Wilmer Cutler Pickering Hale and Dorr LLP

(57) ABSTRACT

A signal processing apparatus includes: a latch circuit; a set pulse generation circuit; a reset pulse generation circuit; and a correction set signal forming circuit. The correction set signal forming circuit forms a correction set signal for applying a set instruction continuously during a time period from a time point of a front edge of the set pulse generated from the set pulse generation circuit or a time point delayed from the time point of the front edge to a time point at which the reset pulse is generated. The correction set signal forming circuit supplies the correction set signal to the set input terminal of the latch circuit.

3 Claims, 6 Drawing Sheets

SIGNAL PROCESSING APPARATUS INCLUDING LATCH CIRCUIT

CROSS-REFERENCE TO RELATED APPLICATIONS

This application is based upon and claims priority from Japanese Patent Application No. 2008-278358 filed on Oct. 29, 2008, the entire contents of which are incorporated herein by reference.

BACKGROUND OF THE INVENTION

1. Technical Field

The present invention relates to a signal processing circuit including a latch circuit suitable for the igniter apparatus or an apparatus similar to the igniter apparatus of an automobile.

2. Description of the Related Art

In an igniter apparatus of an automobile or an internal combustion engine as disclosed in JP-A-11-82269, for example, an ignition switch connected in series an ignition coil may be turned on continuously due to any reason. If such an abnormality occurs, not only a normal ignition can not be performed but also a current continues to flow into the ignition coil and the ignition switch, whereby the ignition coil and the ignition switch may be broken.

SUMMARY OF THE INVENTION

In order to solve this problem, as shown in FIG. 1, it is considered to provide an abnormality detection circuit 2 for detecting the abnormality of a load circuit 1 formed by the igniter circuit. Further, when an abnormality is detected as shown in FIG. 2(B), a set pulse Vin is generated as shown in FIG. 2(C) from a set pulse generation circuit 3 to place a latch circuit 4 in a set state, whereby the output signal Vout of the latch circuit 4 is kept at a high level to control the load circuit 1 in an off state until a reset pulse generation circuit 5 generates a reset pulse Vreset shown in FIG. 2(D).

In FIG. 1, a DC power supply 6 is connected to the load circuit 1 and a voltage stabilizing circuit 7. The output line 8 of the voltage stabilizing circuit 7 is connected to the load circuit 1 and the latch circuit 4. The abnormality detection circuit 2 is connected to an ECU (Engine Control Unit) 14 via a line 9 and a buffer circuit 15. The reset pulse generation circuit 5 is connected to the abnormality detection circuit 2 via a line 10. The set input terminal S of the latch circuit 4 formed by an RS flip flop is connected to the set pulse generation circuit 3 via an NOT circuit 11. The reset input terminal R of the latch circuit is connected to the reset pulse generation circuit 5, and the output terminal Q thereof is connected to the load circuit 1 via a line 12. An ignition signal input line 13 is connected to the load circuit 1.

In FIG. 1, when an ECU signal sent from the ECU 14 is normal, the output signal Va of the abnormality detection circuit 2 is kept at a low level and so the latch circuit 4 is kept to a reset state. When the output signal Va of the abnormality detection circuit 2 changes from the low level to a high level indicating an abnormality at a time point t1 as shown in FIG. 2(B) based on the ECU signal sent from the ECU 14, the output signal Vin of the set pulse generation circuit 3 changes from a high level to a low level at the t1 as shown in FIG. 2(C) and so the set pulse of the low level is obtained. The set pulse is supplied to the set input S of the latch circuit 4 via the NOT circuit (inversion circuit) 11. Thus, the output signal Vout obtained from the output terminal Q of the latch circuit 4 changes from a low level to the high level as shown in FIG. 2(E). If none of an external noise and an internally generated noise having a level of a threshold value Vth or more of the reset input of the latch circuit 4 is not entered at a time point t3, the latch circuit 4 is kept to the set state until a time point t4 where the abnormal state is cancelled and reset in response to the reset pulse shown in FIG. 2(D) generated at the time point t4. However, if one or more of the voltage stabilizing circuit 7, the output line 8, the reset pulse generation circuit 5, a reset signal input line 5a etc. is influenced by an ignition noise or the external noise, the output signal Vreset of the reset pulse generation circuit 5 may change due to the noise N as shown in FIG. 2(D) and cross the threshold value Vth. Thus, since an erroneous reset instruction may be applied to the latch circuit 4 at the time point t3, the output signal Vout of the latch circuit 4 may erroneously change from the high level to the low level at the time point t3, whereby the load circuit 1 may not be protected sufficiently. A similar problem may arise if the voltage Vreg of the output line 8 of the voltage stabilizing circuit 7 reduces to a predetermined value or less due to noise and so the latch circuit 4 is placed in the reset state. Further, also a similar problem may arise when the load circuit 1 is a circuit other than the ignition circuit.

The invention was made in consideration for the circumstances in which a signal processing apparatus having a latch circuit may operate erroneously due to noise. An object of the invention is to provide a signal processing apparatus which can prevent an erroneous operation due to noise.

According to an aspect of the invention, there is provided a signal processing apparatus comprising: a latch circuit comprising a set input terminal, a reset input terminal and an output terminal, and being configured to give a priority to a reset operation; a set pulse generation circuit configured to generate a set pulse for placing the latch circuit in a set state; a reset pulse generation circuit connected to the reset input terminal of the latch circuit; and a correction set signal forming circuit connected to the set pulse generation circuit, the reset pulse generation circuit and the set input terminal of the latch circuit, wherein the correction set signal forming circuit forms a correction set signal for applying a set instruction continuously during a time period from a time point of a front edge of the set pulse generated from the set pulse generation circuit or a time point delayed from the time point of the front edge to a time point at which the reset pulse is generated, and wherein the correction set signal forming circuit supplies the correction set signal to the set input terminal of the latch circuit.

DETAILED DESCRIPTION OF THE EMBODIMENTS

Next, an embodiment of the invention will be explained with reference to drawings.

First Embodiment

Figure 3:
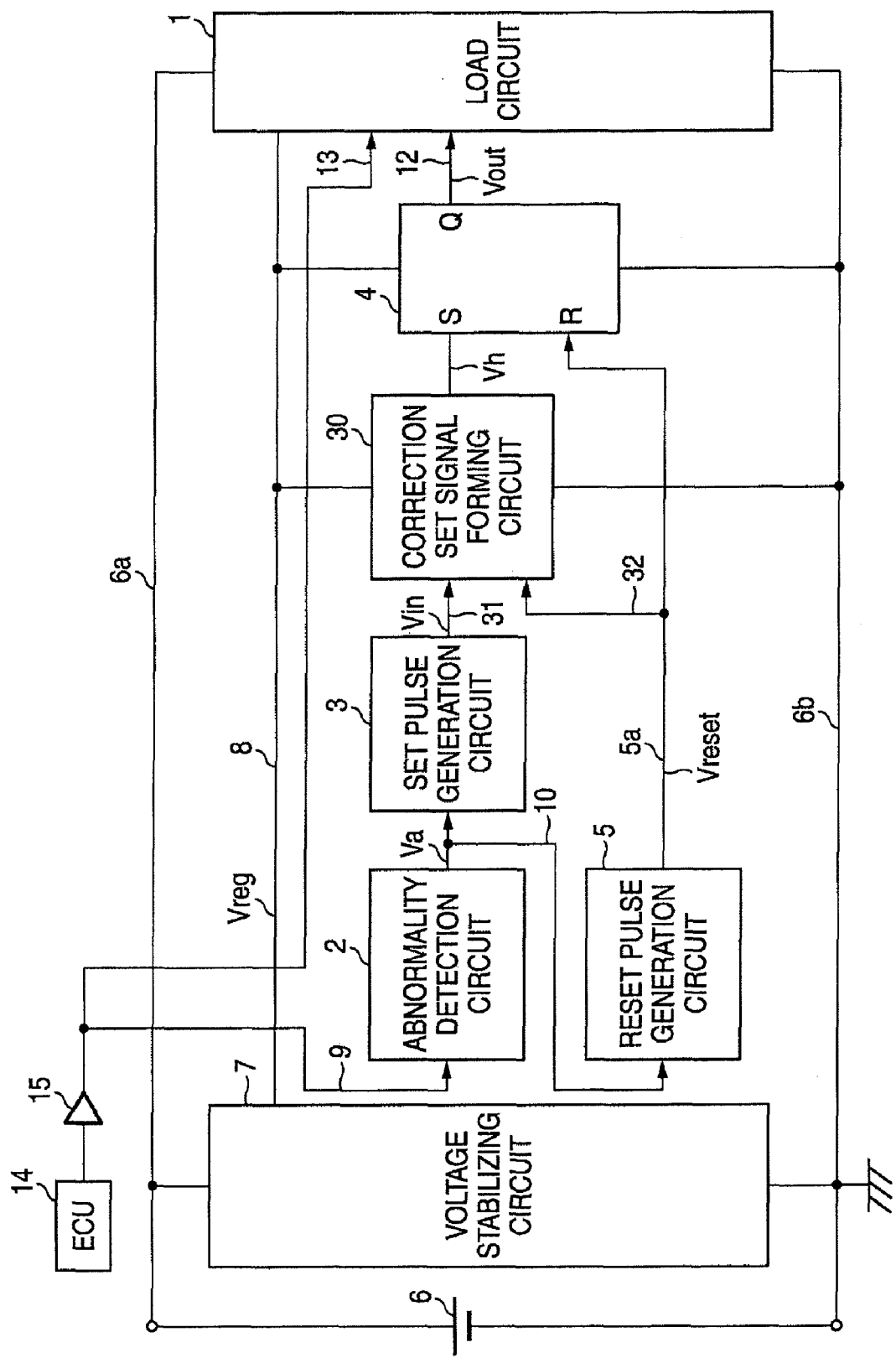
FIG. 3 is a block diagram showing an igniter apparatus according to the invention.
Figure 4:
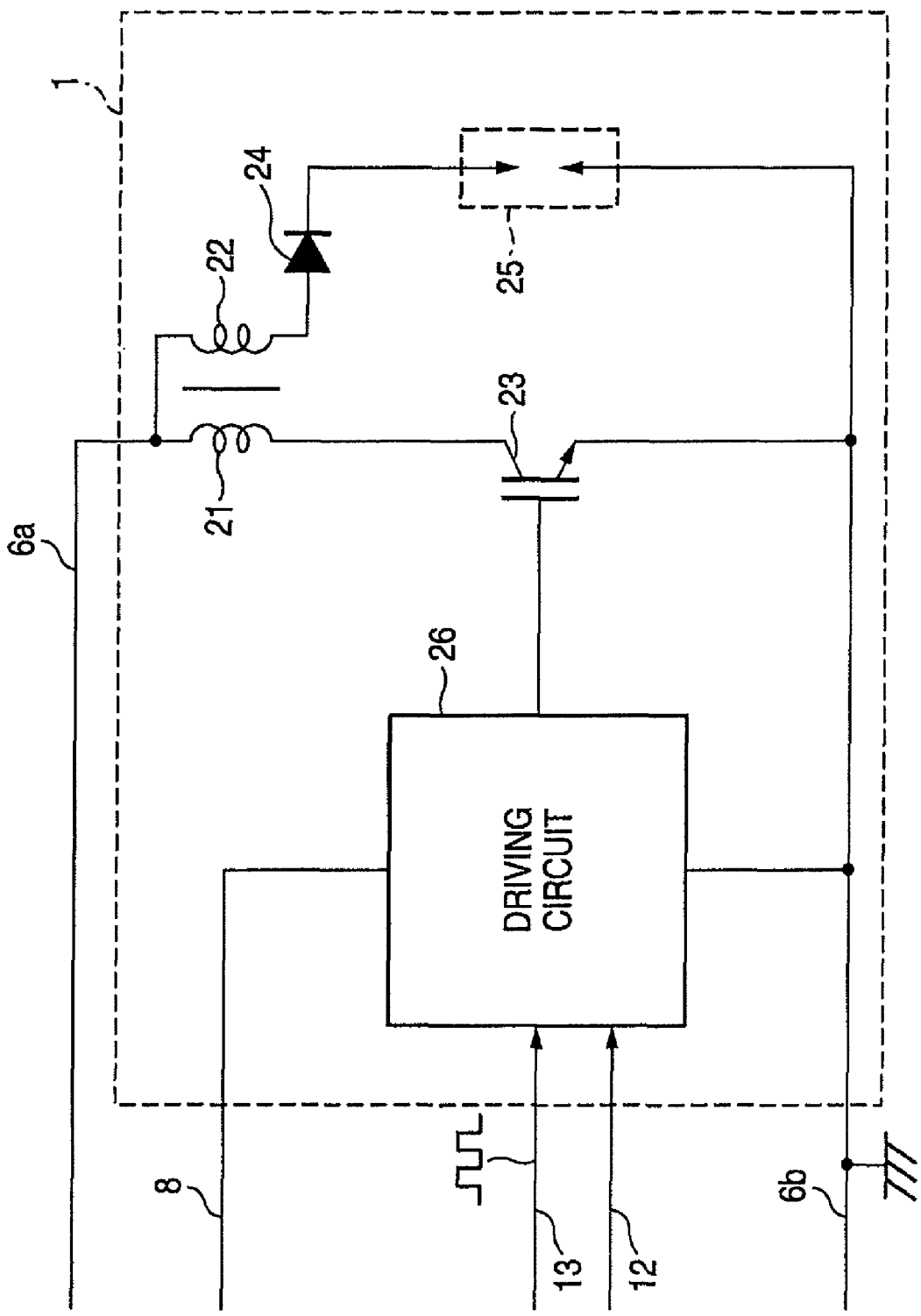
FIG. 4 is a circuit diagram showing the detailed configuration of a load circuit in FIG. 3.

FIG. 3 shows an igniter apparatus for an automobile having a signal processing apparatus according to the first embodiment of the invention. A load circuit 1 formed by an igniter circuit (ignition circuit) is connected to a DC power supply 6 such as a battery via a power supply line 6a and a ground line (common conductor) 6b. The load circuit 1 has a booster transformer (ignition coil) formed by a primary winding 21 and a secondary winding 22 electromagnetically connected thereto as shown in FIG. 4, for example. The primary winding 21 is connected between the power supply line 6a and the ground line 6b via an ignition switch 23 formed by an IGBT. One end of an ignition plug 25 is connected to the upper end of the primary winding 21 via a diode 24 and the secondary winding 22 and the other end thereof is connected to the ground line 6b. The connection of the ignition plug 25 is not limited to the illustrated embodiments, but various modifications may be made. For example, the ignition plug 25 may be connected so as to form a closed circuit together with the primary winding 21. The ignition plug 25 is ignited in response to the turning on/off of the ignition switch 23.

A driving circuit 26 for turning on and off the ignition switch 23 is connected to the control terminal of the ignition switch 23. The power supply terminal of the driving circuit 26 supplied with a control power supply voltage is connected to a voltage stabilizing circuit 7 shown in FIG. 3 via a line 8. The ground terminal of the driving circuit 26 is connected to the power supply line 6a. The voltage stabilizing circuit 7 shown in FIG. 3 is a well known circuit and is configured, for example, by a transistor connected in series with the power supply line 6a, a zener diode connected between the base of this transistor and the ground line 6b and a resistor connected between the base and the collector of this transistor.

An input line 13 connected to the driving circuit 26 supplies a signal for turning on and off the ignition switch 23.

In order to prevent the abnormal operation of the ignition switch 23, the driving circuit 26 is connected to a latch circuit 4 shown in FIG. 3 via a line 12. When the output signal Vout of the latch circuit 4 shown in FIG. 3 indicates a set state, the driving circuit 26 controls the ignition switch 23 in an off state. The turning-off control of the ignition switch 23 is attained by connecting the control terminal of the ignition switch 23 to the ground line 6b, for example.

The latch circuit 4 shown in FIG. 3 is formed by an RS flip-flop giving the priority to a reset operation and has a set input terminal S, a reset input terminal R, an output terminal Q, a control power supply terminal and a ground terminal. The set input terminal S of the latch circuit 4 is connected to a correction set signal forming circuit 30 according to the invention. The reset input terminal R of the latch circuit 4 is connected to a reset pulse generation circuit 5 via a reset signal input line 5a. The output terminal Q of the latch circuit 4 is connected to the driving circuit 26 shown in FIG. 4 contained in the load circuit 1 via the line 12. The power supply terminal of the latch circuit 4 is connected to the voltage stabilizing circuit 7 via the line 8 and the ground terminal thereof is connected to the ground line 6b.

Figure 5:
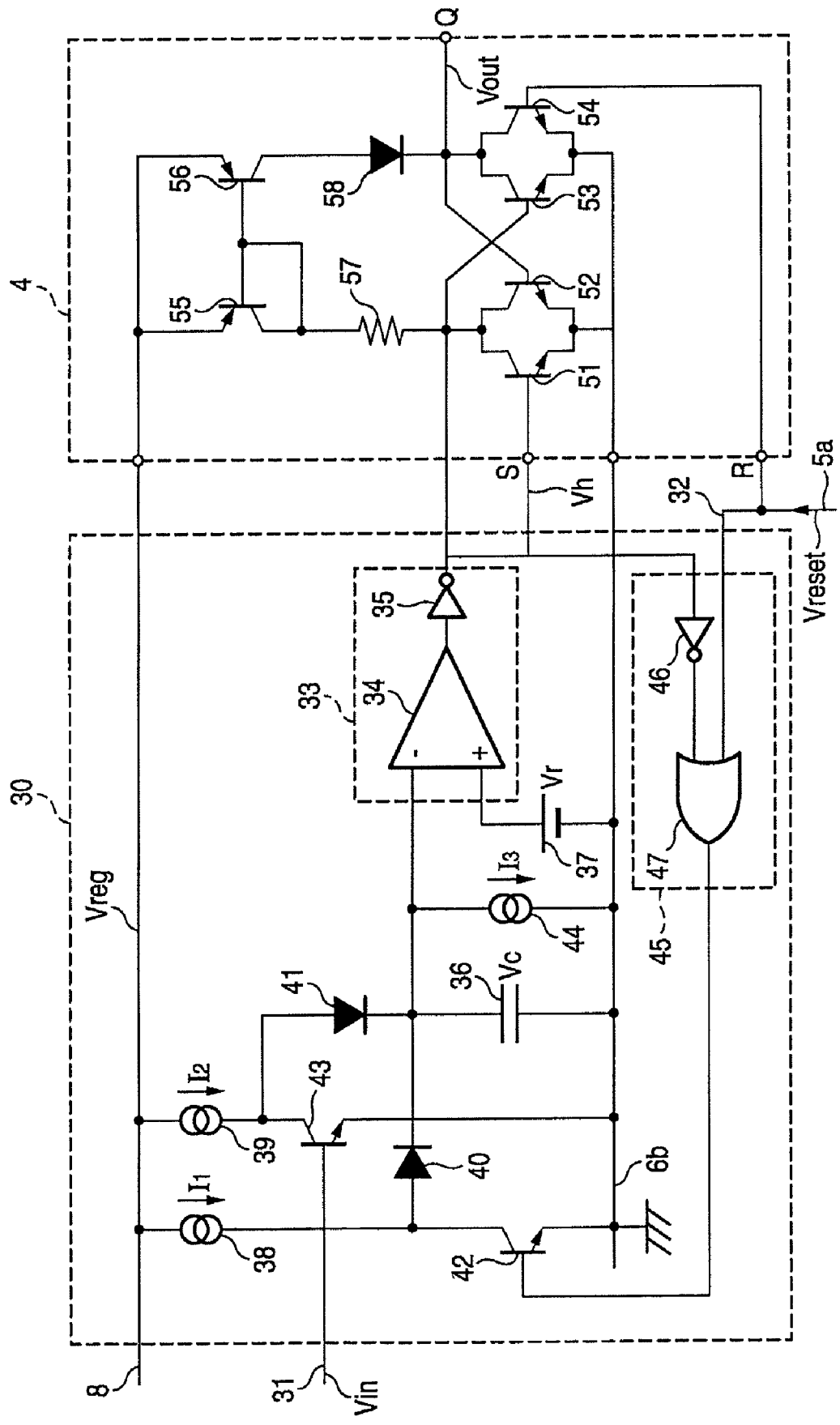
FIG. 5 is a circuit diagram showing the detailed configuration of a correction set pulse forming circuit and a latch circuit.

An example of the latch circuit 4 is shown in FIG. 5. The latch circuit 4 shown in FIG. 5 is formed by six transistors 51, 52, 53, 54, 55, 56, a resistor 57 and a diode 58. The base of the transistor 51 is connected to the set input terminal S, the base of the transistor 54 is connected to the reset input terminal R, and the collector of the transistor 54 is connected to the output terminal Q. Since an RS flip-flop constituting the latch circuit 4 is well known, the detailed explanation thereof will be omitted. The latch circuit 4 is not limited to the circuit arrangement shown in FIG. 5 but may be replaced by the well-known RS flip-flop etc. formed by combining plural logical gate circuits.

Figure 1:
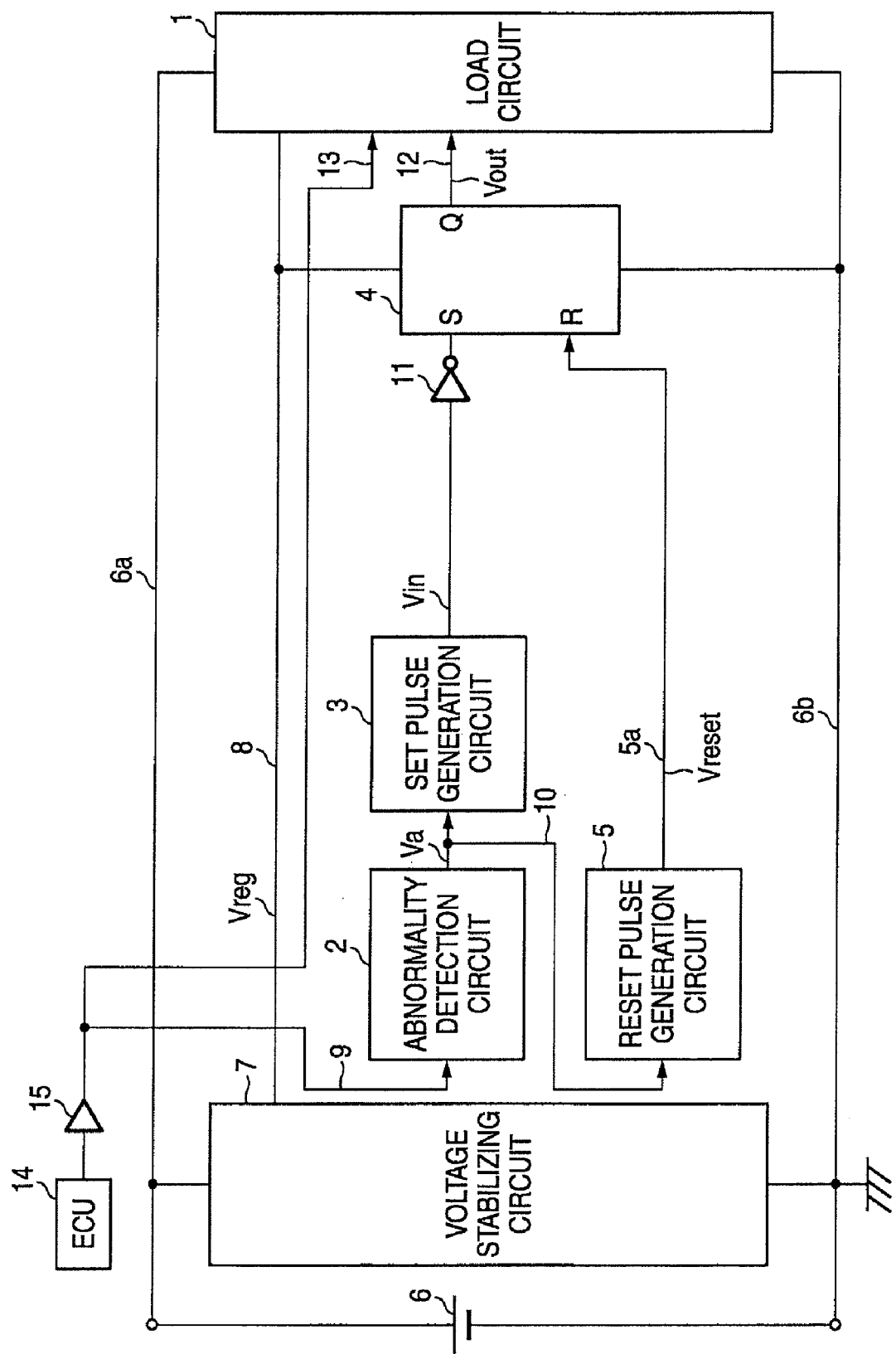
FIG. 1 is a block diagram showing one example of igniter apparatus including a latch circuit.
Figure 2:
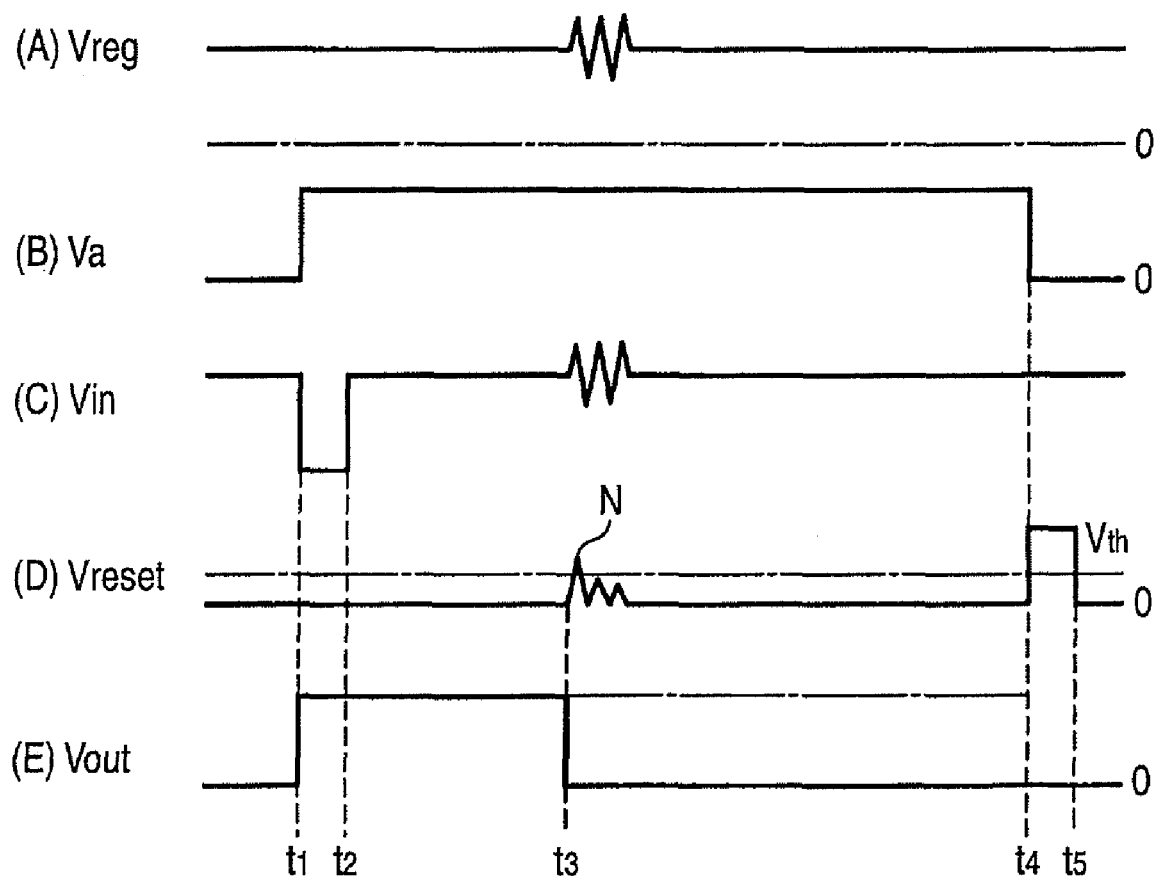
FIG. 2 is waveform diagrams showing states at respective portions in FIG. 1.

As shown in FIG. 3, the abnormality detection circuit 2, the set pulse generation circuit 3, the reset pulse generation circuit 5 and a correction set signal forming circuit 30 are provided in order to control the latch circuit 4. Like FIG. 1, the abnormality detection circuit 2 shown in FIG. 3 is connected to an ECU (Engine Control Unit) 14 via a line 9 and a buffer circuit 15 and outputs a signal Va shown in FIG. 6(B) when detects an ignition abnormality based on an ECU signal. The abnormality detection circuit 2 may be modified so as to detect the abnormality of a load (ignition abnormality) based on the detection of the voltage or current of the load circuit 1 (for example, detection of the voltage or current of the ignition switch 23). Alternatively, the ECU 14 may supply to the abnormality detection circuit 2 a signal capable of detecting the abnormality separately from the ECU signal to be supplied to the load circuit 1 from the ECU 14. The abnormality detection circuit 2 may be contained in the ECU 14.

The set pulse generation circuit 3 connected to the abnormality detection circuit 2 generates a set pulse of a low level having a time width from a time point t1 to a time point t2 as shown in FIG. 6(C) in response to that the output signal Va of the abnormality detection circuit 2 shown in FIG. 6(B) changes from a low level to a high level at the time point t1. The output signal Vin of the set pulse generation circuit 3 restores to the high level after maintaining the low level during a constant time width (from t1 to t2). The set pulse shown in FIG. 6(C) is not directly supplied to the latch circuit 4 as it is but corrected by the correction set signal forming circuit 30.

The reset pulse generation circuit 5 is connected to the abnormality detection circuit 2 via a line 10 and generates a reset pulse during a time width from a time point t4 to a time point t5 as shown in FIG. 6(F) in response to that the output signal of the abnormality detection circuit 2 shown in FIG. 6(B) changes from the high level to the low level at the time point t4. The output signal Vreset of the reset pulse generation circuit 5 is sent to the reset input terminal R of the latch circuit 4 via a reset signal input line 5a.

Figure 6:
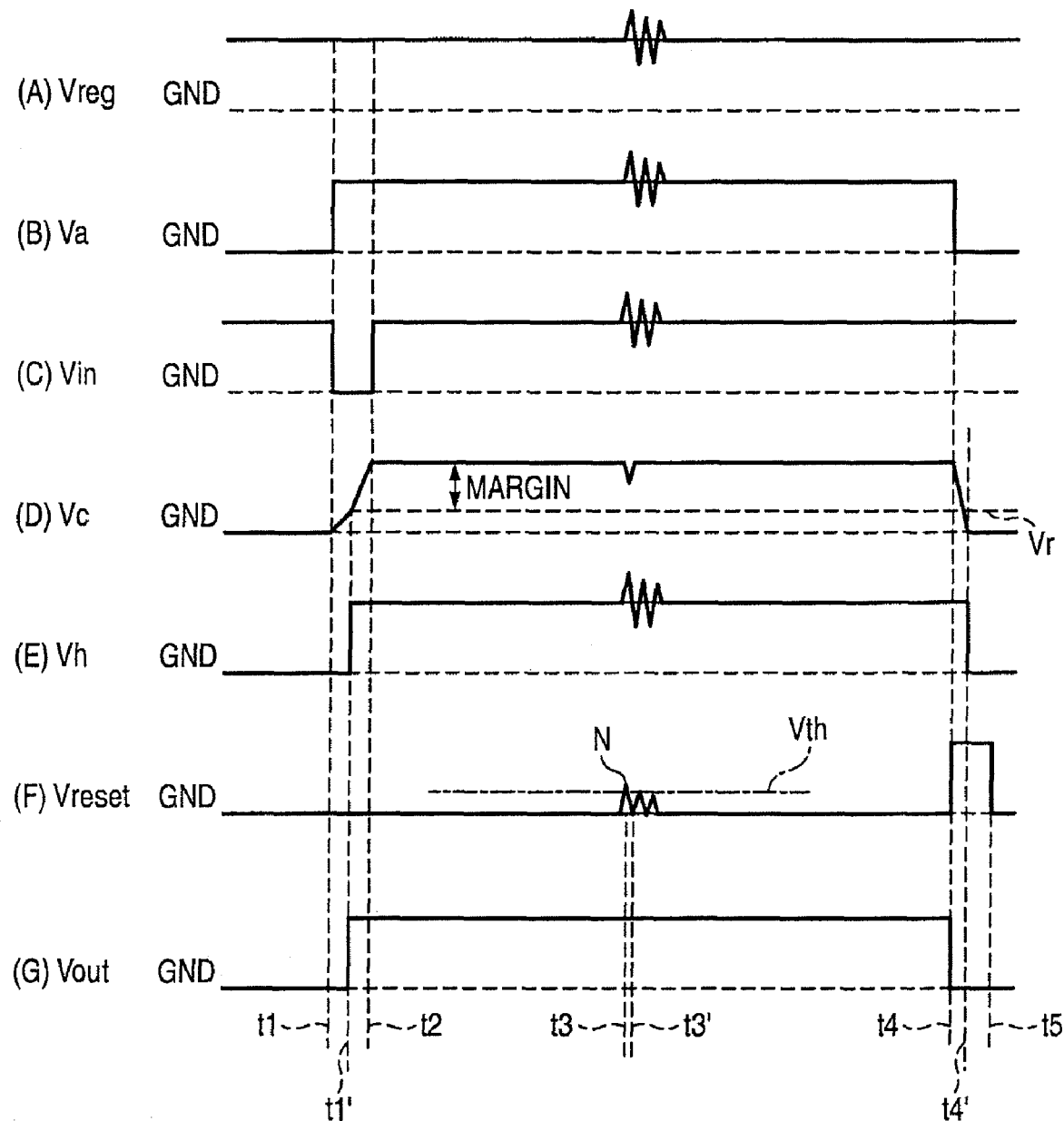
FIG. 6 is waveform diagrams showing states at respective portions in FIG. 3.

The correction set signal forming circuit 30 according to the invention is connected to the set pulse generation circuit 3 via a line 31 and also connected to the reset pulse generation circuit 5 via a line 32 and the reset signal input line 5a. The output terminal of this correction set signal forming circuit is connected to the set input terminal S of the latch circuit 4 via a transmission line of the output signal Vh of this circuit. The power supply terminal of the correction set signal forming circuit 30 is connected to the voltage stabilizing circuit 7 via the line 8 and the ground terminal thereof is connected to the ground line 6b. The output signal Vh of the correction set signal forming circuit 30 becomes a high level indicating a set instruction during a time period from a time point t1' slightly delayed from the set pulse generating time point t1 to a reset pulse generating time point t4' as shown in FIG. 6(E). Although, in FIG. 6, the output signal Vh of the correction set signal forming circuit 30 changes into the high level at the time point t1' slightly delayed from the set pulse generating time point t1, the output signal may be changed into the high level substantially simultaneous with the set pulse generating time point t1. Further, the output signal Vh of the correction set signal forming circuit 30 may be changed into the low level substantially simultaneous with the time point t4. The correction set signal forming circuit 30 has a function equivalent to expanding the time width from t1 to t2 of the set pulse shown in FIG. 6(C) to the time width from t1 to t4 shown in FIG. 6(E) longer than the time width of the set pulse. Thus, the high level signal during the time width from t1' to t4' shown in FIG. 6(E) may be called a correction set pulse. The effects of the correction set pulse will be explained later.

FIG. 5 shows the detailed configuration of an example of the correction set signal forming circuit 30. The correction set signal forming circuit 30 includes a comparison unit 33 having one input terminal, the other input terminal and an output terminal connected to the set input terminal S of the latch circuit 4; a capacitor 36 connected between the one input terminal of the comparison unit 33 and the ground line 6b; a reference voltage source 37 connected between the other input terminal of the comparison unit 33 and the ground line 6b; a first constant current circuit 38 connected to the circuit via the line 8; a first reverse current prevention diode 40 connected between the first constant current circuit 38 and the diode 36, a first switch 42 formed by an npn transistor connected in parallel to the capacitor 36 via the first reverse current prevention diode 40; a second constant current circuit 39 connected to the line 8 through which the DC voltage is supplied; a second reverse current prevention diode 41 connected between the second constant current circuit 39 and the diode 36; a second switch 43 formed by an npn transistor connected in parallel to the capacitor 36 via the second reverse current prevention diode 41; a third constant current circuit 44 connected in parallel to the capacitor 36; and a switch control circuit 45 which controls the first switch 42 so as to be an off state in response to the output of the output of the comparison unit 33 indicating that the voltage of the capacitor 36 is higher than the reference voltage Vr of the reference voltage source 37 and also controls the first switch 42 so as to be an on state in response to the reset pulse.

The comparison unit 33 is formed by a voltage comparator 34 having the well known hysteresis characteristics and an NOT circuit 35. The inverting input terminal of the voltage comparator 34 is connected to the capacitor 36, the non-inverting input terminal thereof is connected to the reference voltage source 37, and the output terminal thereof is connected to the set input terminal S of the latch circuit 4 via the NOT circuit 35. The NOT circuit 35 may be eliminated by connecting the inverting input terminal of the voltage comparator 34 to the reference voltage source 37 and by connecting the non-inverting input terminal thereof to the capacitor 36.

The switch control circuit 45 is formed by an NOT circuit 46 and an OR (logical sum) circuit 47. The one input terminal of the OR circuit 47 is connected to the output terminal of the comparison unit 33 via the NOT circuit 46, whilst the other input terminal of the OR circuit is connected to the reset signal input line 5a via the line 32.

The control terminal (base) of the second switch 43 of the correction set signal forming circuit 30 is connected to the set pulse generation circuit 3 shown in FIG. 3. Thus, the second switch 43 is turned off in response to the set pulse of the low level during the period from t1 to t2 shown in FIG. 6(C). As a result, the capacitor 36 is charged by a second current I2 flowing through the second constant current circuit 39 and the second reverse current prevention diode 41. The second current I2 of the second constant current circuit 39 is set to be larger than a third current I3 of the third constant current circuit 44. Thus, when the set pulse is generated, since the capacitor 36 is charged by the second current I2 despite that the third current I3 acting as a discharge circuit of the capacitor 36 flows, the voltage Vc of the capacitor increases gradually as shown by a dotted line in FIG. 6(D). When the voltage Vc of the capacitor 36 becomes higher than the reference voltage Vr at the time point t1' shown in FIG. 6, the output of the voltage comparator 34 becomes a low level and so the output of the NOT circuit 35, that is, the output signal Vh of the comparison unit 33 becomes the high level as shown in FIG. 6(E). When the output signal Vh of the comparison unit 33 becomes the high level, each of the NOT circuit 46 and the OR circuit 47 becomes a low level to thereby turn the first switch 42 off. Thus, since a first current I1 is supplied to the capacitor 36 via the first constant current circuit 38 and the first reverse current prevention diode 40, the voltage Vc of the capacitor 36 becomes a value sufficiently higher than the reference voltage Vr as shown in FIG. 6(D) to thereby maintain the output signal Vh of the comparison unit 33 to the high level. When the set pulse of the low level at the line 31 terminates at the time point t2 in FIG. 6, the second switch 43 is turned on to thereby terminate the current flowing of the second current I2 into the capacitor 36. Since the first current I1 is set to be larger than the third current I3, the voltage Vc of the capacitor 36 is kept at an almost constant value (a value limited based on Vreg) from the time point t2 as shown in FIG. 6(D), so that the high level state of the output signal Vh of the comparison unit 33 is secured during the time period from t1' to t4' in FIG. 6. When the output signal Va of the abnormality detection circuit 2 changes into the low level indicating the normal state at the time point t4 as shown in FIG. 6(B) and so the reset pulse generation circuit 5 generates the reset pulse of the high level as shown in FIG. 6(F), the output of the OR circuit 47 becomes the high level to thereby turn the first switch 42 on. Thus, since the supply of the first current I1 to the capacitor 36 is stopped, the charges accumulated in the capacitor 36 is discharged via the third constant current circuit 44 and so the output signal Vh of the comparison unit 33 becomes the low level at the time point t4' slightly delayed from the set pulse generating time point t4. When the output signal Vh of the comparison unit 33 becomes the low level, the output of the NOT circuit 46 becomes a high level to thereby maintain the on state of the first switch 42.

If not interfered by noise, when the output signal Vh of the correction set signal forming circuit 30 shown in FIG. 6(E) is supplied to the set input terminal S of the latch circuit 4 and the output signal Vreset of the reset pulse generation circuit 5 shown in FIG. 6(F) is supplied to the reset input terminal R thereof, the latch circuit 4 is placed in the set state at the time point t1' and then placed in the reset state at the time point t4' as shown in FIG. 6(G). Thus, despite that the correction set signal forming circuit 30 is added, the operation of the latch circuit 4 becomes substantially same as the case where the latch circuit 4 is operated based on the set pulse generated at the time point t1 shown in FIG. 6(C) and the reset pulse generated at the time point t4 shown in FIG. 6(F).

In the case where an external noise or an igniter noise is superimposed on the output signal Vreset of the reset pulse generation circuit 5 and enters into the reset input of the latch circuit 4 at a time point t3 in FIG. 6(F), if the noise level is higher than the threshold value Vth of the reset input, the noise acts like the reset pulse. Thus, the latch circuit 4 is placed in the reset state during the time period from t3 to t3' to thereby place the output voltage of the latch circuit 4 in the low level.

Further, although not shown, also in the case where an external noise or an igniter noise is superimposed on the power supply line 8 for supplying Vreg from the voltage stabilizing circuit to thereby instantaneously reduce the power supply voltage of the latch circuit to a value less than the normal operation voltage thereof, the latch circuit 4 is placed in the reset state like the time point t3 shown in FIG. 6(F) to thereby place the output voltage of the latch circuit 4 in the low level.

Thus, the first switch 42 of the correction set signal forming circuit 30 is tuned on during the time period from t3 to t3' to thereby interrupt the supply of the first current I1 to the capacitor 36. However, when the noise generation period is short, since the voltage Vc of the capacitor 36 does not becomes smaller than the reference voltage Vr, the output signal Vh of the comparison unit 33 is kept at the high level state. Since the high level of the output signal Vh of the comparison unit 33 acts as the set signal of the latch circuit 4, when the reset signal due to the noise N disappears at the time point t3', the latch circuit 4 is again set by the output signal Vh of the comparison unit 33, whereby the output signal Vout of the latch circuit again restores to the high level at the time point t3'. Thereafter, when the output signal Va of the abnormality detection circuit 2 shown in FIG. 6(B) becomes the low level indicating the normal state at the time point t4, the reset pulse generation circuit 5 generates the normal reset pulse to reset the latch circuit 4, whereby the output signal Vout of the latch circuit becomes the low level. Further, when the normal reset pulse is supplied to the reset input line 32 of the OR circuit 47 of the correction set signal forming circuit 30, the output of the OR circuit 47 becomes the high level to turn the first switch 42 on, so that the charging operation of the capacitor 36 by the current I1 stops. Thus, since the capacitor 36 is discharged via the third constant current circuit 44, the voltage of this capacitor reduces to a value smaller than the reference voltage Vr, whereby the correction set signal forming circuit 30 is restored to the initial state.

Even if the output signal Vout of the latch circuit 4 becomes the low level during the period from t3 to t3' as shown in FIG. 6(G) to thereby instantaneously interrupt the off state control of the ignition switch 23, there arises no problem since this output signal is intended to place the ignition switch 23 in the off state completely.

This embodiment has the following advantages.

(1) The correction set signal forming circuit 30 supplies the set instruction continuously to the latch circuit 4 from the time point t1 of the front edge of the set pulse or the delayed time point t1' to the time point t4' slightly delayed from the reset pulse generating time point t4. Thus, even if the igniter noise or the external noise is superimposed on the power supply voltage on the power supply line 6a to place the latch circuit 4 into the reset state or the reset signal on which noise is superimposed enters into the latch circuit 4 to place the latch circuit 4 into the reset state, the latch circuit 4 is set again when the noise disappears. Thus, the set state (latch state) output almost corresponding to the time period from the set pulse to the normal reset pulse can be obtained from the latch circuit 4. As a result, since the latch circuit 4 can be placed in the set state almost in corresponding to the period during which the output signal Va of the abnormality detection circuit 2 indicates the abnormality, the load circuit 1 can be protected preferably.

(2) Since the charging/discharging operation of the capacitor 36 is performed by the first, second and third constant current circuits 38, 39 and 44, the voltage Vc of the capacitor 36 can be set to the desired value preferably.

The invention is not limited to the aforesaid embodiment and may be modified in the following manner, for example.

(1) The set pulse may be modified as a high level pulse.

(2) The invention can be applied to a case where the load circuit 1 is a circuit other than the igniter.

What is claimed is:

1. A signal processing apparatus comprising:
   a latch circuit comprising a set input terminal, a reset input terminal and an output terminal, and being configured to give a priority to a reset operation;
   a set pulse generation circuit configured to generate a set pulse for placing the latch circuit in a set state;
   a reset pulse generation circuit connected to the reset input terminal of the latch circuit; and
   a correction set signal forming circuit connected to the set pulse generation circuit, the reset pulse generation circuit and the set input terminal of the latch circuit,
   wherein the correction set signal forming circuit forms a correction set signal for applying a set instruction continuously during a time period from a time point of a front edge of the set pulse generated from the set pulse generation circuit or a time point delayed from the time point of the front edge to a time point at which the reset pulse is generated, and
   wherein the correction set signal forming circuit supplies the correction set signal to the set input terminal of the latch circuit.

2. The signal processing apparatus according to claim 1, further comprising:
   a unit configured to place a load circuit in an off state by an output indicating a set of the latch circuit; and
   an abnormality detection circuit which detects an abnormality of the load circuit,
   wherein the set pulse generation circuit generates the set pulse in response to an output signal indicating an abnormality from the abnormality detection circuit, and
   wherein the reset pulse generation circuit generates the reset pulse in response to that the output signal indicating an abnormality from the abnormality detection circuit disappears.

3. The signal processing apparatus according to claim 1, wherein the correction set signal forming circuit comprises:
   a voltage comparison unit comprising a first input terminal, a second input terminal and an output terminal which is connected to the set input terminal of the latch circuit;
   a capacitor which is connected between the first input terminal of the voltage comparison unit and a ground;
   a reference voltage source which is connected between the second input terminal of the voltage comparison unit and the ground;
   a first constant current circuit which is connected to a DC power supply;
   a first reverse current prevention diode which is connected between the first constant current circuit and the capacitor;
   a first switch which is connected in parallel to the capacitor via the first reverse current prevention diode;
   a second constant current circuit which is connected to the DC power supply;
   a second reverse current prevention diode which is connected between the second constant current circuit and the capacitor;
   a second switch which is connected in parallel to the capacitor via the second reverse current prevention diode, the second switch having a control terminal connected to the set pulse generation circuit and having characteristics of being placed in an off state in response to the set pulse;
   a third constant current circuit which is connected in parallel to the capacitor; and
   a switch control circuit which controls the first switch in an off state in response to the output of the comparison unit indicating that the voltage of the capacitor is higher than a reference voltage of the reference voltage source and controls the first switch in an on state in response to the reset pulse.

* * * * *